(12) United States Patent
Rengarajan

(10) Patent No.: US 6,194,278 B1
(45) Date of Patent: Feb. 27, 2001

(54) DEVICE PERFORMANCE BY EMPLOYING AN IMPROVED METHOD FOR FORMING HALO IMPLANTS

(75) Inventor: Rajesh Rengarajan, Poughkeepsie, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/337,168

(22) Filed: Jun. 21, 1999

(51) Int. Cl.⁷ .................................................. H01L 21/336
(52) U.S. Cl. ..................... 438/302; 438/303; 438/304; 438/305
(58) Field of Search ............................ 438/302–305, 438/228, 247, 299

(56) References Cited

U.S. PATENT DOCUMENTS

| | | | |
|---|---|---|---|
| 5,908,313 | * 6/1999 | Chau et al. | 438/299 |
| 5,937,293 | * 8/1999 | Lee | 438/247 |
| 5,970,353 | * 10/1999 | Sultan | 438/302 |
| 6,008,099 | * 12/1999 | Sultan et al. | 438/305 |
| 6,020,231 | * 1/2000 | Wang et al. | 438/228 |

* cited by examiner

*Primary Examiner*—David Nelms
*Assistant Examiner*—Dung A Le
(74) *Attorney, Agent, or Firm*—Donald B. Paschburg

(57) ABSTRACT

In accordance with the present invention, a method for forming a halo implant for semiconductor devices includes the steps of providing a substrate having a gate stack formed thereon. The gate stack includes a gate conductor. The gate stack extends a distance in a first direction on a surface of the substrate. Dopants of a first conductivity and dosage are provided at an acute angle relative to a normal to the surface of the substrate. The dopants are also directed at an angle of between about 30 degrees to about 60 degrees relative to the first direction such that the dopants are implanted below the gate conductor to form a halo implant for preventing current leakage for a semiconductor device.

21 Claims, 12 Drawing Sheets

DEVICE PERFORMANCE BY EMPLOYING
AN IMPROVED METHOD FOR FORMING
HALO IMPLANTS

BACKGROUND

1. Technical Field

This disclosure relates to semiconductor fabrication and more particularly, to a method for improving halo implants for semiconductor devices to improve performance.

2. Description of the Related Art

Semiconductor devices include transistors formed integrally with a substrate. Since the substrate is commonly used by many transistors and for components of a same transistor, current leakage may occur.

Referring to FIG. 1, a cross-sectional view of a semiconductor device is shown. Semiconductor device 10 includes a substrate 12, which is preferably a lightly doped crystalline material, such as silicon. In previous steps, which are known to those skilled in the art, a gate stack 14 is formed on substrate 12. Gate stack 14 includes a gate oxide 16 and a conductive material for a gate conductor 18, such as polysilicon. Gate stack 14 may include other layers as well, for example a silicide or other higher conductive material. Gate stack 14 is preferably protected from implantation by employing a nitride cap 20 and nitride spacers 22. Diffusion regions are formed in substrate 12 on opposite sides of gate stack 14. Dopants are implanted in theses regions by bombarding substrate 12 with the dopants. It is desirable to have the halo dopants penetrate below gate stack 14. This may be accomplished by permitting dopants to impact a surface 24 of substrate at angle of about 10–30 degrees. This permits dopants to penetrate below gate stack 14.

As described above, since dopant regions on both sides of the gate are relatively close, a halo implantation is performed prior to formation of sources and drains for transistors on substrate 12. Referring to FIG. 2, a field effect transistor 32 is shown. Transistor 32 includes gate stack 14 between two diffusion regions. The diffusion regions which are formed by the dopant implantation described above. The diffusion regions include a source 34 and a drain 36. Prior to formation of source 34 and drain 36, halo implant 38 is formed to reduce current leakage from source 34 and drain 36. Halo implants 38 include a conductivity opposite the conductivity of source 34 and drain 36.

Referring to FIG. 3, a semiconductor wafer 40 is shown. Wafer 40 includes a plurality of chips 42 formed thereon. Wafer 40 includes a notch 44 which is employed to provide a reference for semiconductor fabrication processes. Lines 46 are provided to indicate angles relative to notch 44. These angles include 0 degrees, 90 degrees, 180 degrees, and 270 degrees. Detail 4 is indicated in FIG. 3. Detail 4 is magnified in FIGS. 4 and 5 and illustratively shows an orientation of gate conductors 18 along a chip 42.

As shown in FIG. 4, gate conductors 18 are arranged parallel to a direction of notch 44 (notch direction is illustratively indicated in FIG. 4). For conventional halo implant processes, implantation is directed at an angle (i.e. 10 degrees–30 degrees with respect to a normal to the surface of wafer 40) to implant under gate conductors 18. To get under the gate the implantation tool is aimed or directed perpendicular to the direction of gate conductors 18 (i.e. along the 270 degrees direction and the 90 degrees direction). This is in addition to the angle formed with a surface normal of the substrate (as shown in FIG.1). This means wafer 40 (FIG. 3) is rotated to these positions in a processing chamber to provide the implantation under gate conductors 18. In this way, dopants may be implanted under a portion of gate conductor 18.

As shown in FIG. 5, gate conductors 18 are oriented perpendicular to notch 44 (notch direction is illustratively indicated in FIG. 5). The perpendicular and parallel orientations shown in FIGS. 4 and 5 represent a highly desirable arrangement for gate conductors 18 since notch 44 is used to indicate direction for the fabrication process. Since gate conductors in FIG. 5 are rotated by 90 degrees, the implantation tool is now aimed in the 0 degrees direction and the 180 degrees.

Referring to FIG. 6, a top view of a gate conductor 18 with source 34 and drain 36 formed therein is shown. Arrows A are indicated only as a reference to illustratively show the direction of implantation of halo implant 38 (FIG. 2). In a conventional device, source 34 and drain 36 are counter-doped by the halo to a concentration of about 3D where D is a halo dose of between about $1 \times 10^{12}$ to about $1 \times 10^{13}$ atoms/cm$^2$. Under gate conductor 18, a concentration of about D is provided in regions 50 and 52. These relatively high dopant concentrations are subject to high current leakage.

The dopant concentration (D) under gate conductors may be insufficient. Since, halo implant 38 does not extend far enough below gate conductors 18, a higher concentration of dopants (source/drain dopants) may not be sustainable without experiencing performance degradation. For example, a threshold voltage roll-off for the transistor may be increased and/or junction capacitance (between source 34 and drain 36) may be increased.

Therefore, a need exists for a method for implanting a higher halo dose under a gate which does not degrade performance. A further need exists for a method for forming a halo implant which provides reduced junction capacitance and reduced threshold voltage roll-off to improve semiconductor device performance.

SUMMARY OF THE INVENTION

In accordance with the present invention, a method for forming a halo implant for semiconductor devices includes the steps of providing a substrate having a gate stack formed thereon. The gate stack includes a gate conductor. The gate stack extends a distance in a first direction on a surface of the substrate. Dopants of a first conductivity and dosage are provided at an acute angle relative to a normal to the surface of the substrate. The dopants are also directed at an angle of between about 30 degrees to about 60 degrees relative to the first direction such that the dopants are implanted below the gate conductor to form a halo implant for preventing current leakage for a semiconductor device.

Also, in accordance with the present invention, another method for forming a halo implant for semiconductor devices comprising the steps of providing a substrate having a gate stack formed thereon, the gate stack including a gate conductor, the gate stack extending a distance in a first direction on a surface of the substrate, providing dopants of a first conductivity and dosage at an acute angle relative to a normal to the surface of the substrate, directing the dopants at an angle of between about 30 degrees to about 60 degrees relative to the first direction such that the dopants are implanted below the gate conductor to form a halo implant, implanting dopants of a second conductivity type over the halo implant to form source and drain regions for the semiconductor device, the halo implant for preventing current leakage from the source and drain regions, and providing a portion of the dopants of the second conductivity type below the gate conductor to stabilize a threshold voltage for the semiconductor device during operation.

Yet another method for forming a halo implant for semiconductor devices includes the steps of providing a substrate having a plurality of gate stacks formed thereon. The gate stacks are disposed substantially parallel to each other and extend a distance in a first direction on a surface of the substrate. Each gate stack includes a gate conductor. Dopants are implanted into the substrate by bombarding the substrate with dopants of a first conductivity and dosage at an acute angle relative to a normal to the surface of the substrate and directing the dopants at an angle of substantially about 45 degrees relative to the first direction such that the dopants are implanted below the gate conductor to form a halo implant. The halo implant has a portion extending laterally below the gate stacks. The halo implant prevents current leakage from source and drain regions during the operation of field effect transistors. The steps of implanting dopants of a second conductivity type over the halo implant to form the source and drain regions for the field effect transistors, and providing a portion of the dopants of the second conductivity type below the gate conductor to stabilize a threshold voltage for the semiconductor device during operation are also included.

In alternate methods, the acute angle may be between about 10 degrees and about 30 degrees. The halo implant may laterally extend between about 50 nm to about 150 nm below the gate stack. The step of directing the dopants may include the steps of directing the dopants at an angle of between about 30 degrees to about 60 degrees relative to the first direction at a first position, rotating the semiconductor device to a second position, and directing the dopants at an angle of between about 30 degrees to about 60 degrees relative to the first direction at the second position. The method may further include the steps of rotating the semiconductor device to a third position, directing the dopants at an angle of between about 30 degrees to about 60 degrees, preferably about 45 degrees relative to the first direction at the third position, rotating the semiconductor device to a fourth position, and directing the dopants at an angle of between about 30 degrees to about 60 degrees, preferably about 45 degrees, relative to the first direction at the fourth position. The step of directing the dopants may include the step of providing a dose of between about 1.5 D to about 2.5 D below the gate conductor where D is a dose of between about $1 \times 10^{12}$ to about $1 \times 10^{13}$ atoms/cm$^2$. The step of forming a source and drain over the halo implant, the source and drain including dopants having a second conductivity type and including a dose of between about 1.5 D to about 2.5 D where D is a dose of between about $1 \times 10^{12}$ to about $1 \times 10^{13}$ atoms/cm$^2$ may also be included.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides an improved halo implantation method which improves device performance. By aiming a dopant implantation beam at an angle relative to gate conductors, a halo implant is provided which extends further below the gate conductors. In this way, a higher dopant concentration (of source and drain dopants) below the gate conductor may be sustained. This higher dopant concentration below the gate conductor improves operating performance while including the current leakage advantages of providing a halo implant. Further, since a higher dopant concentration is provided under the gate conductor, the source and drain of the transistor devices may include a lower dopant concentration. This is explained in greater detail below.

Figure 1:
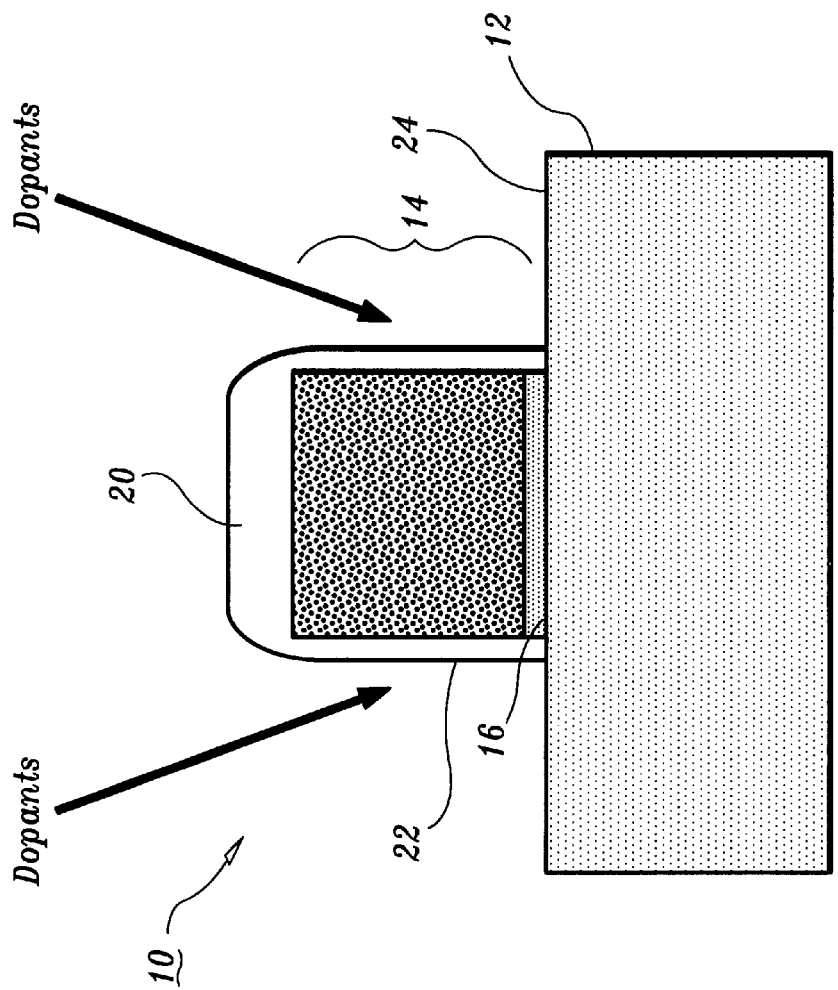
FIG. 1 is a cross-sectional view of a semiconductor device showing dopant implantation in accordance with the prior art.
Figure 2:
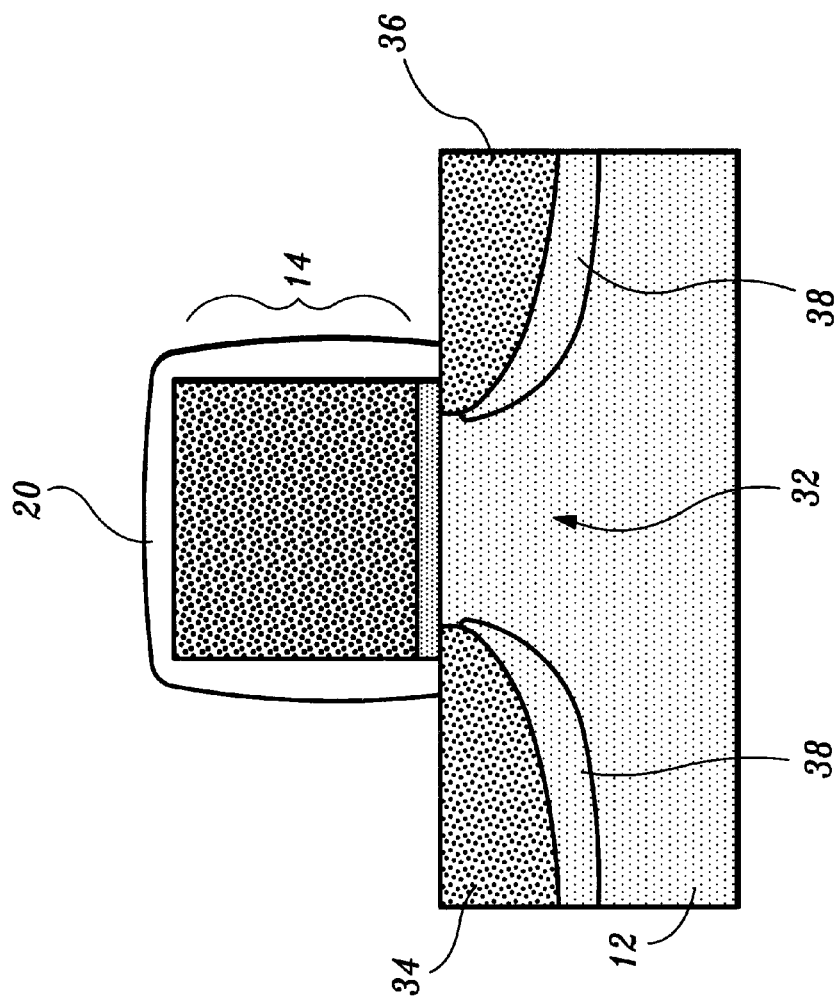
FIG. 2 is a cross-sectional view of the semiconductor device of FIG. 1 showing source and drain regions formed in accordance with the prior art.
Figure 3:
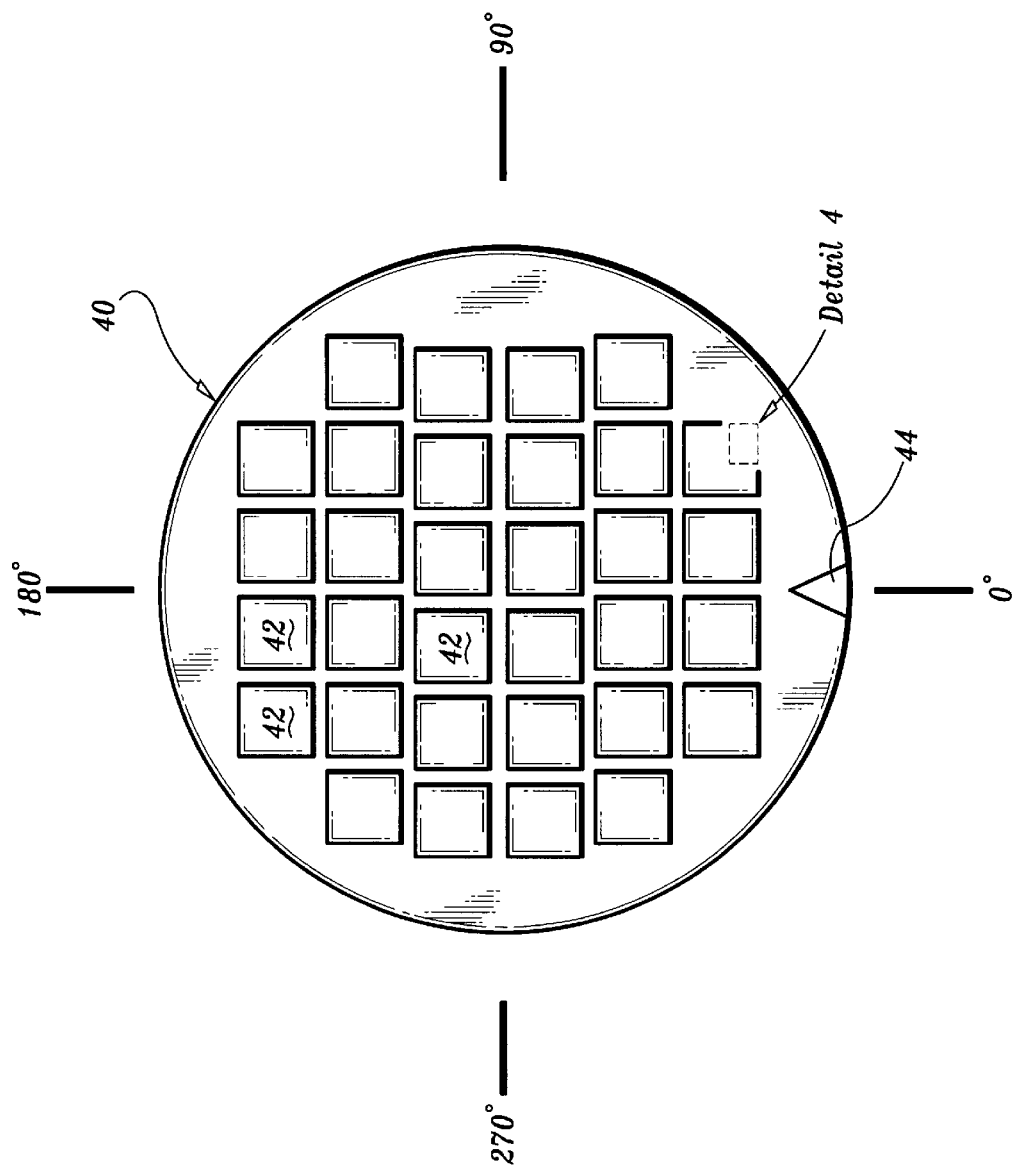
FIG. 3 is a top view of a semiconductor wafer showing a plurality of chips disposed thereon and having dopant implant direction markings indicated in accordance with the prior art.
Figure 4:
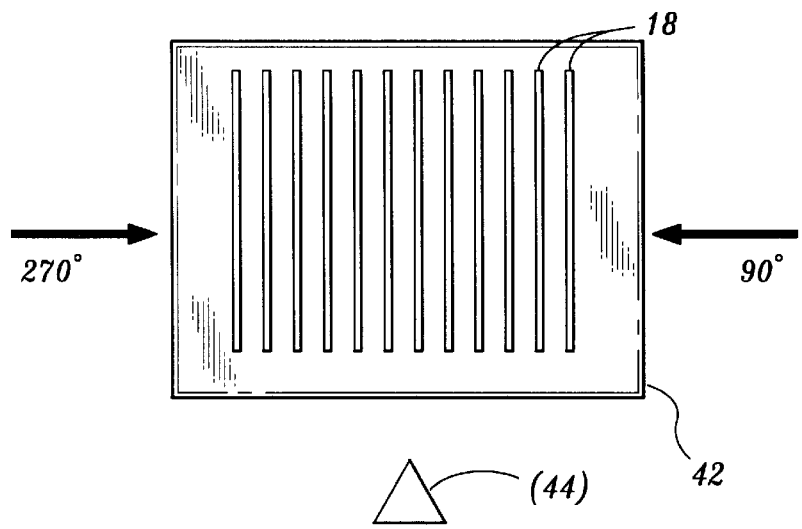
FIG. 4 is a magnified view of detail 4 of FIG. 3 showing gate stack/gate conductor orientation in accordance with the prior art.
Figure 5:
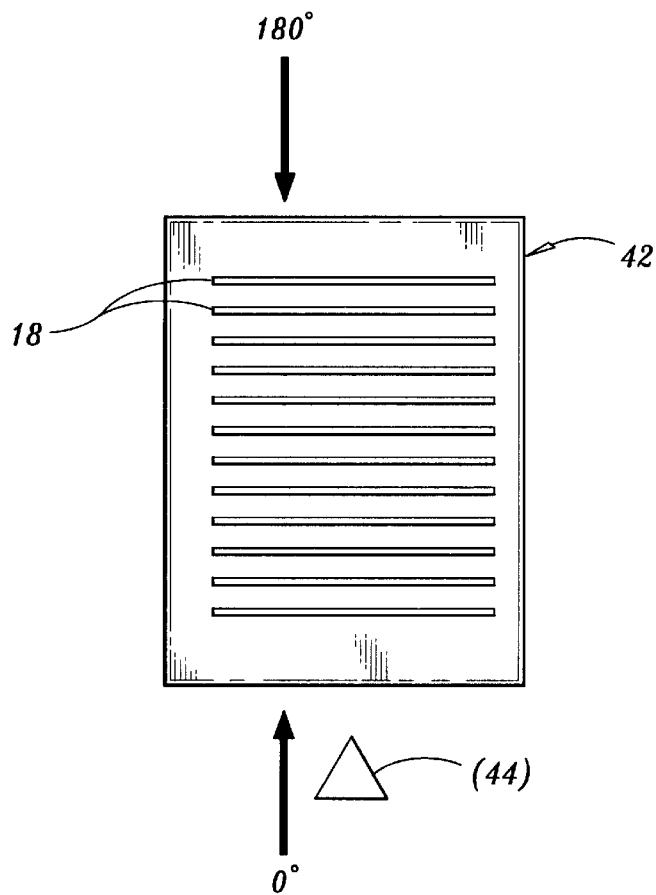
FIG. 5 is a magnified view of detail 4 of FIG. 3 showing another gate stack/gate conductor orientation in accordance with the prior art.
Figure 6:
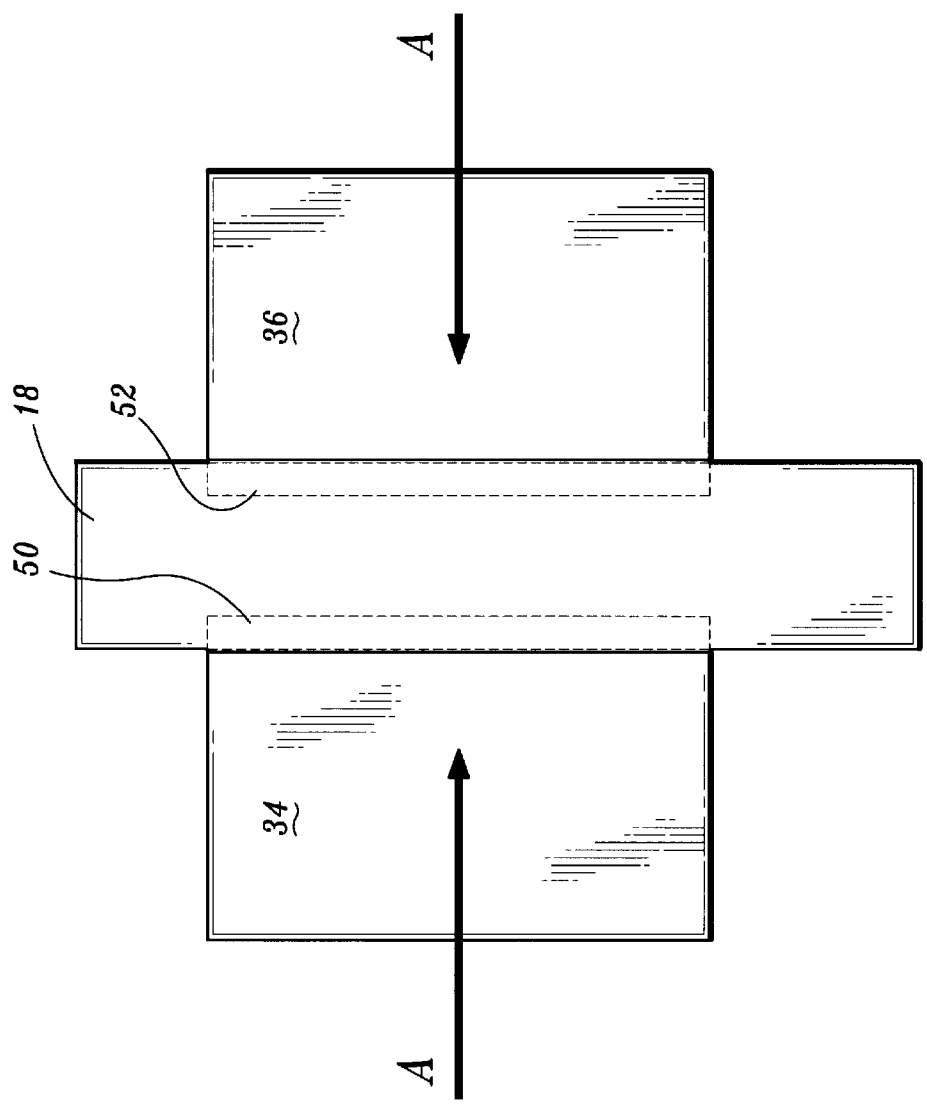
FIG. 6 is a top view of a transistor showing dopants below a gate conductor in accordance with the present invention.
Figure 7:
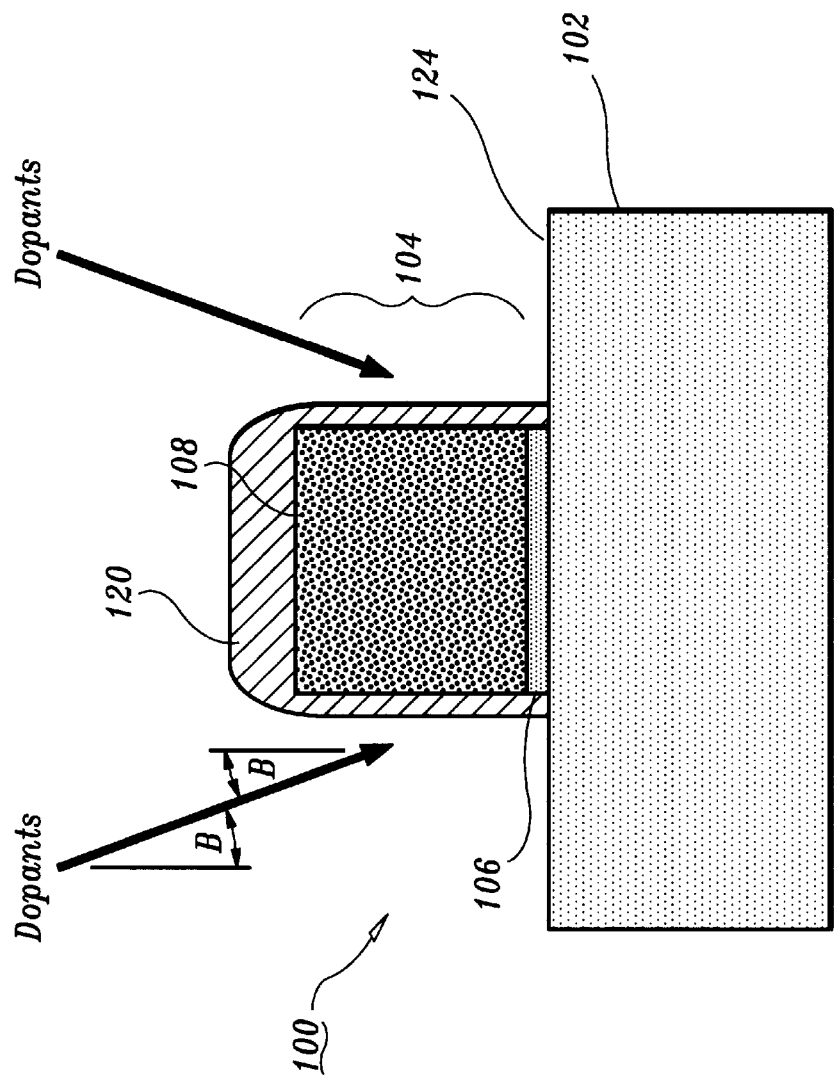
FIG. 7 is a cross-sectional view of a semiconductor device showing dopant implantation for the formation of a halo in accordance with the present invention.

Referring now in specific detail to the drawings in which like reference numerals identify similar or identical elements throughout the several views, FIG. 7, a cross-sectional view of a semiconductor device 100 is shown. Semiconductor device 100 includes a substrate 102, which is preferably a lightly doped crystalline material, such as silicon. A gate stack 104 is formed on substrate 102. Gate stack 104 preferably includes a gate dielectric 106, such as an oxide and a conductive material for a gate conductor 108, such as polysilicon, preferably doped polysilicon. Gate stack 104 may include other layers as well, for example a silicide, such as tungsten silicide or other higher conductive material for improving conductivity for gate conductor 108. Gate stack 104 is preferably protected from implantation by employing a cap or protective cover 120. Cap 120 is preferably formed from a nitride.

Figure 8:
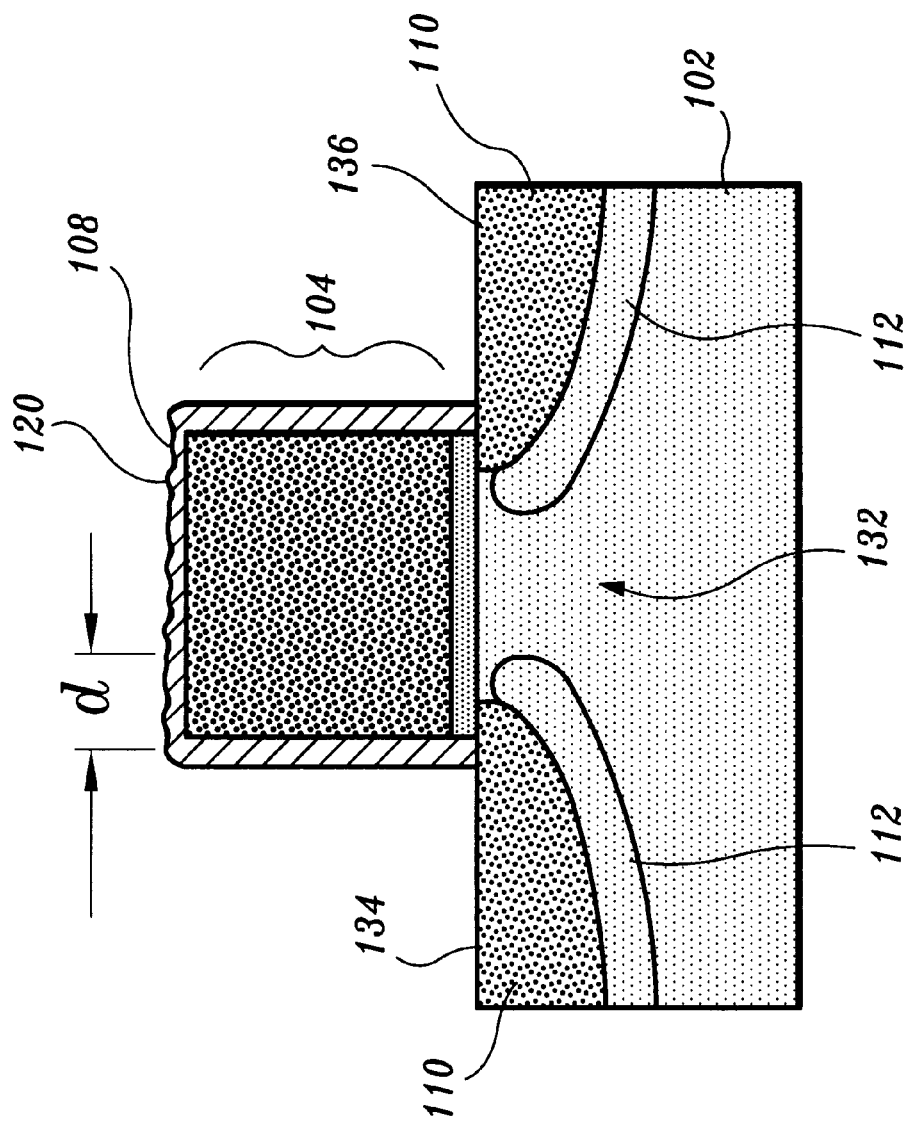
FIG. 8 is a cross-sectional view of the semiconductor device of FIG. 7 showing source and drain regions formed on the halo in accordance with the present invention.

In accordance with the present invention, a halo implantation is performed. This process includes an ion implantation of halo dopants having opposite conductivity of dopants which will be implanted for source and drain regions as shown in FIG. 8. Halo implantation may be accomplished by permitting dopants to impact a surface 124 of substrate 102 at an angle B of between about 10 to about 30 degrees. The dopants are aimed from a dopant source (not shown). This implantation permits dopants to penetrate below gate stack 104. The present invention is able to laterally extend the halo implantation dopants further below gate stack 104 than conventional methods. This is accomplished by aiming the dopant source at an angle other than perpendicular to gate conductor 108 lines as will be described below.

Referring to FIG. 8, halo implantation regions 112 are formed by the halo implantation process. Halo implantation regions 112 extend below gate stack 104. Diffusion regions 110 are formed in substrate 102 on opposite sides of gate stack 104. Dopants are implanted in theses regions by bombarding substrate 102 with the dopants having a conductivity opposite the conductivity of halo dopants. For example, if diffusion region dopants are n-type, halo dopants are p-type or vice versa.

It is desirable to have the diffusion region dopants penetrate below gate stack 104. In accordance with the present invention, since halo implantation regions 112 extend further below gate stack 104, a higher dopant concentration of the diffusion region dopants can be sustained in this region. The ion implantation of diffusion regions 110 is preferably adjusted to provide an increased dopant level below gate stack 104. A field effect transistor 132 includes gate stack 104 between two diffusion regions 110. Diffusion regions 110 which are formed by the dopant implantation include a source 134 and a drain 136 for transistor 132.

Figure 9:
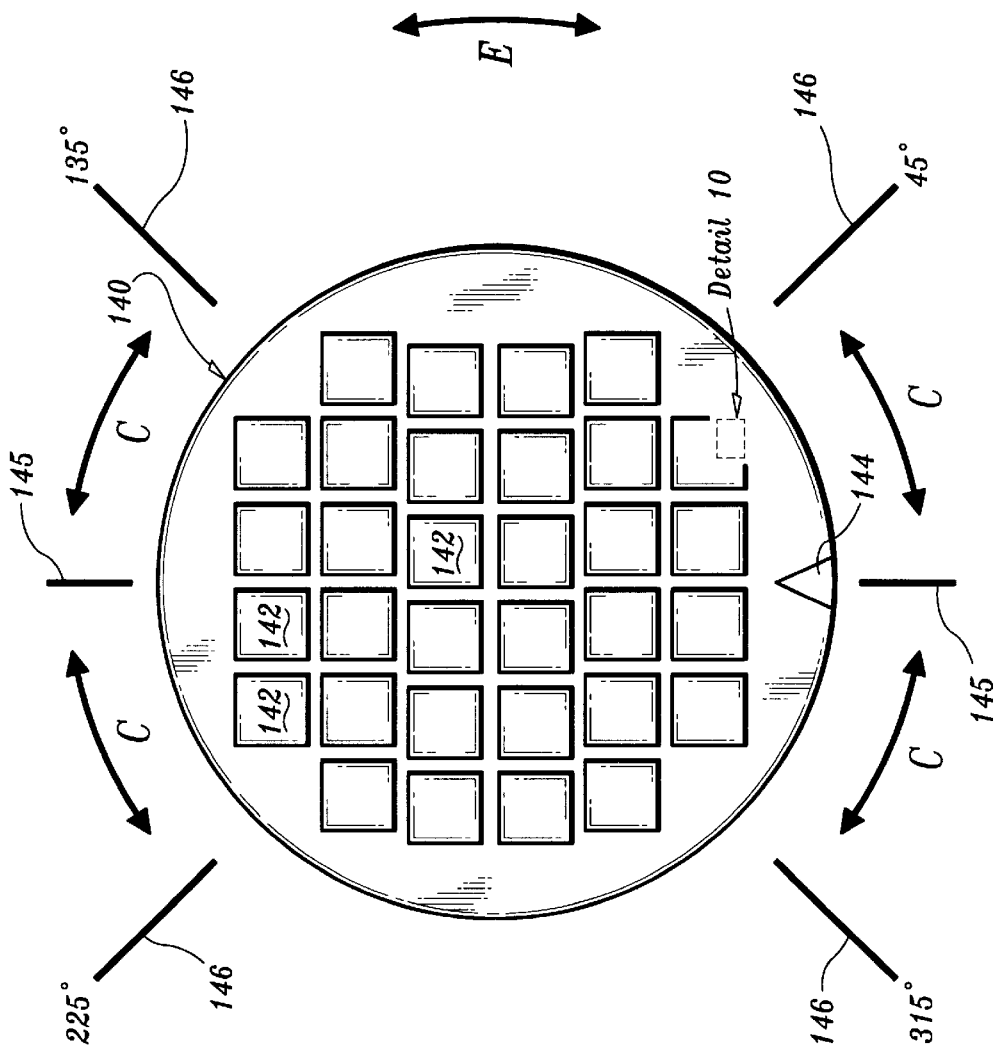
FIG. 9 is a top view of a semiconductor wafer showing a plurality of chips disposed thereon and having dopant implant direction markings indicated in accordance with the present invention.

Referring to FIG. 9, a semiconductor wafer 140 is shown which includes a plurality of chips 142 formed thereon. Wafer 140 includes a notch 144 which is employed to provide a reference for semiconductor fabrication processes. Lines 146 are provided to indicate angles C relative to gate conductors 108 (See FIGS. 10 and 11) which are preferably oriented relative to notch 144. In accordance with the present invention these angles C are preferably between 5 degrees to about 85 degrees relative to lines 145, and more preferably between about 30 degrees to about 60 degrees relative to lines 145. Lines 145 are preferably oriented either substantially parallel or perpendicular to gate conductors 108 (See FIGS. 10 and 11). FIG. 9 illustratively indicates a preferred embodiment of the present invention where lines 146 include 45 degrees, 135 degrees, 225 degrees, and 315 degrees relative to notch 144. Halo dopant source (not shown) is aimed along these angles to form halo implantation regions 112. For example, wafer 140 is turned in the direction of arrow "E", halo dopants are implanted by bombarding wafer 140 along one of lines 146. Then water 140 is again turned in the direction of arrow "E" until a next line 146 is in line with the direction of dopants for a dopant source. Implantation is commenced for a preset time, and then wafer 140 is rotated to the next of lines 146, etc. This may be performed in one, two or all four directions as indicated by lines 146. Surprisingly, by implanting halo implantation regions 112 employing an implantation direction at an angle C relative to lines 145 and gate conductors 108 (FIGS. 10 and 11), the present invention provides a halo implant which extends further below gate conductor 108 than provided by prior art techniques. For example, halo implantation regions 112 extend a distance d as indicated in FIG. 8. Distance d is between about 50 nm to about 150 nm which is significantly further than prior art halo implants. Detail 10 is indicated in FIGS. 10 and 11.

Figure 10:
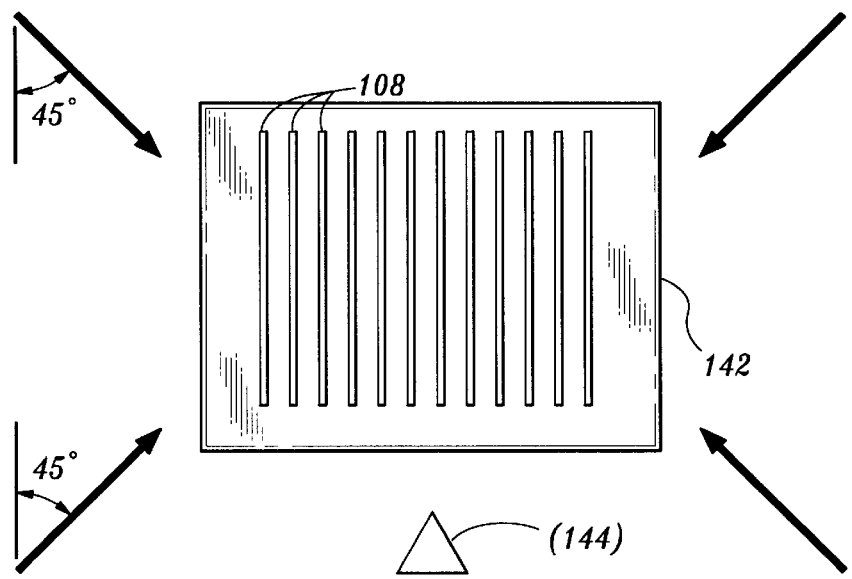
FIG. 10 is a magnified view of detail 10 of FIG. 9 showing gate stack/gate conductor orientation in accordance with the present invention.

As shown in FIG. 10, gate conductors 108 are arranged parallel to a direction of notch 144 which is illustratively shown to indicate direction. For halo implantation processes in accordance with the present invention, implantation is directed at an angle B (i.e. 10 degrees–30 degrees with respect to a normal to the surface of wafer 140 as shown in FIG. 7) to implant halo dopants under gate conductor 108. Advantageously, to get under gate conductor 108, the implantation source is aimed at an angle C, preferably 45 degrees, to the direction of gate conductors 108. Wafer 140 is rotated to these positions in a processing chamber to provide the implantation under gate conductors 108.

Figure 11:
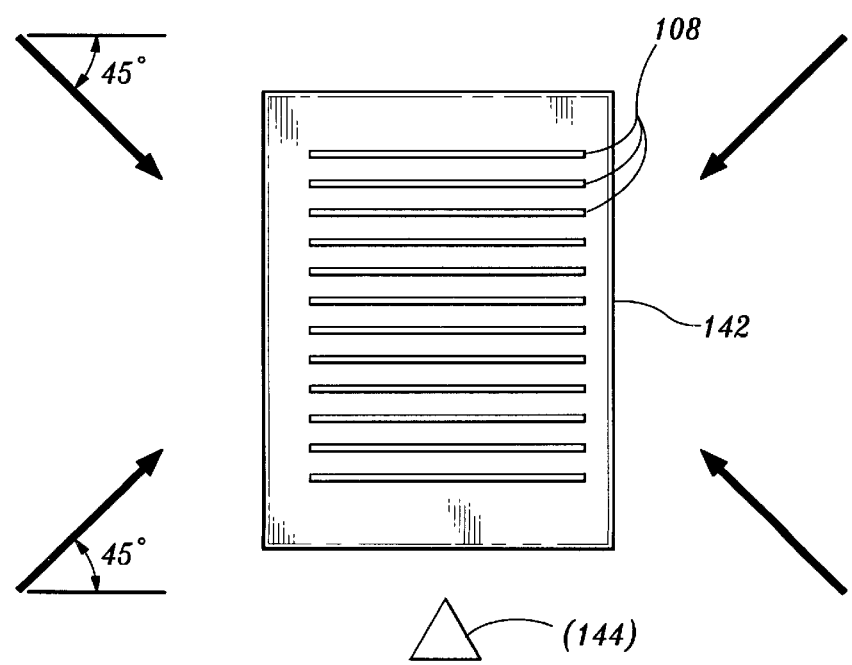
FIG. 11 is a magnified view of detail 10 of FIG. 9 showing another gate stack/gate conductor orientation in accordance with the present invention.

As shown in FIG. 11, gate conductors 108 are oriented perpendicular to notch 144 which is illustratively shown to indicate direction. The perpendicular and parallel orientations shown in FIGS. 10 and 11 represent a highly desirable arrangement for gate conductors 108 since notch 144 is used to indicate direction for process of semiconductor device 100 (i.e., on chips 142). Although gate conductors in the design shown in FIG. 11 are rotated by 90 degrees relative to the design of FIG. 10, the implantation tool is still aimed to provide a substantially 45 degrees angle with gate conductors 108.

Figure 12:
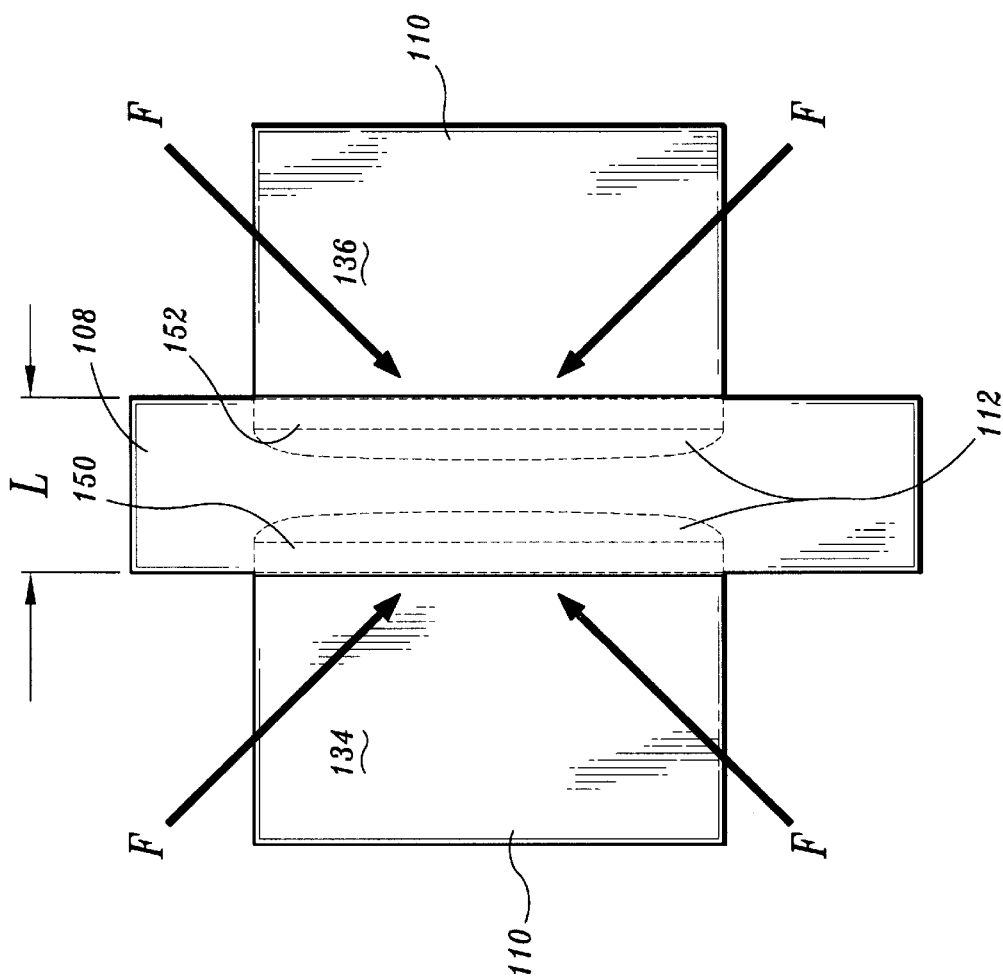
FIG. 12 is a top view of a transistor showing a halo implant and diffusion region dopants below a gate conductor in accordance with the present invention.

Referring to FIG. 12, a top view of a gate conductor 108 with a source 134 and a drain 136 formed therein is shown. Arrows F are indicated only as a reference to illustratively show the direction of implantation for halo implantation regions 112. In accordance with the present invention, dopant concentration of halo implant in source 134 and drain 136 may be reduced without compromising performance since the dopant concentration below gate conductor 108 is increased. In preferred embodiments, halo implant concentrations in source region 134 and drain region 136 are between about 1.5 to about 2.5 times D where D is a dose of between about $1\times10^{12}$ to about $1\times10^{13}$ atoms/cm$^2$. Advantageously, due to the improved halo implantation region 112, a concentration of about 1.5 D to about 2.5 D of diffusion region 110 dopants is preferably provided in regions 150 and 152 below gate conductor 108.

The reduced dopant concentrations of halo implants in source 134 and drain 136 result in lower junction capacitance and consequently improved performance compared with the prior art. To prevent leakage, halo implantation regions 112 may have a concentration of between about 1.5 D to about 4 D, although other concentrations are contemplated.

By providing reduced halo implant concentrations in source and drain regions, reduced junction leakage and reduced junction capacitance are achieved by the present invention. Device performance is further achieved by improving threshold voltage roll-off due to increased halo concentration below gate conductor.

Figure 13:
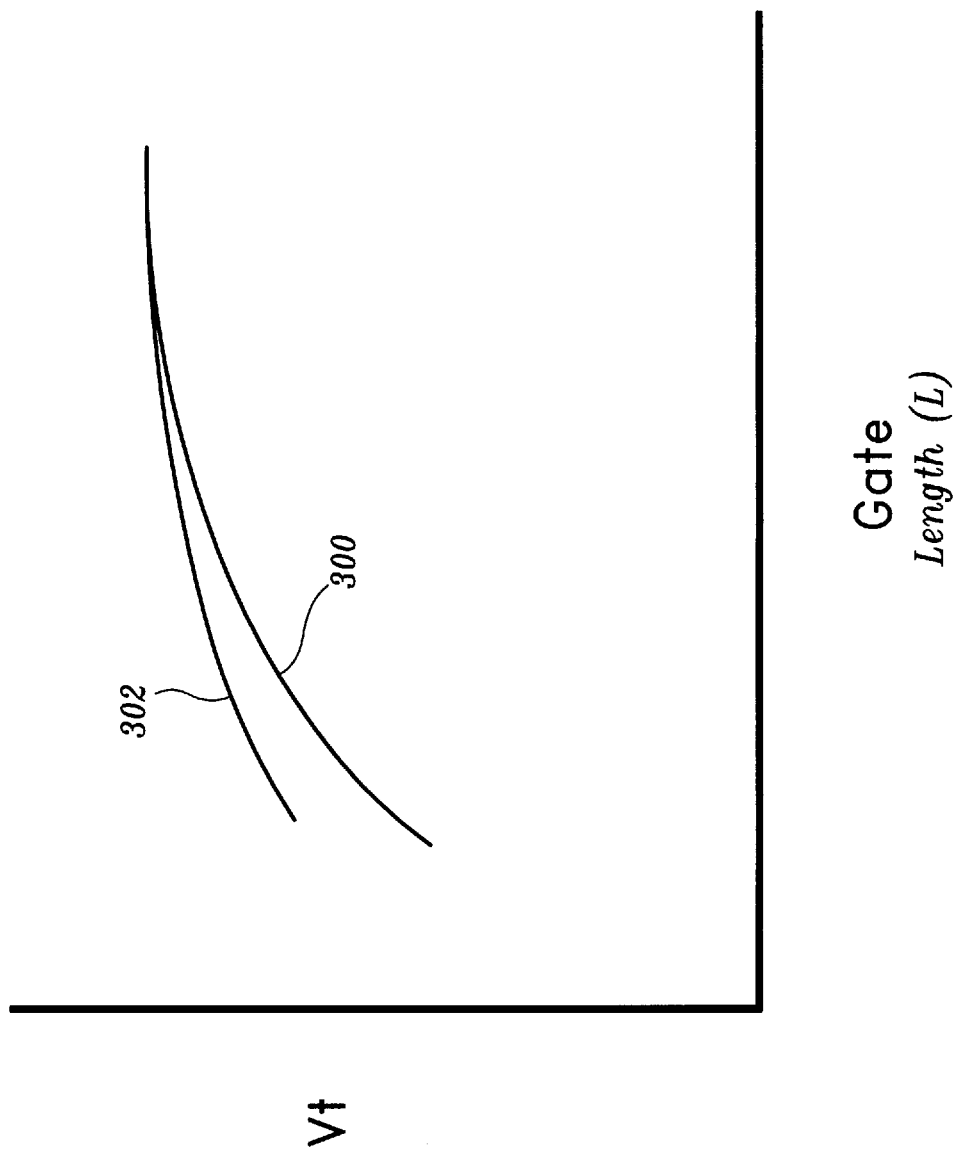
FIG. 13 is a graph of transistor performance showing threshold voltage (Vt) versus gate length (L) for a transistor formed by conventional methods and a transistor formed in accordance with the present invention.

Referring to FIG. 13, an illustrative graph of threshold voltage versus gate conductor length (L) is shown. A curve 300 shows the threshold voltage of a transistor in accordance with the prior art. Curve 300 represents the case of halo implantation using conventional techniques. A curve 302 illustratively represents the threshold voltage of a transistor device formed by a halo implantation in accordance with the present invention. A constant threshold voltage curve is desirable. By providing an improved halo implantation, device performance is improved. As such, curve 302 shows a significant improvement in threshold voltage roll-off for the present invention.

Figure 14:
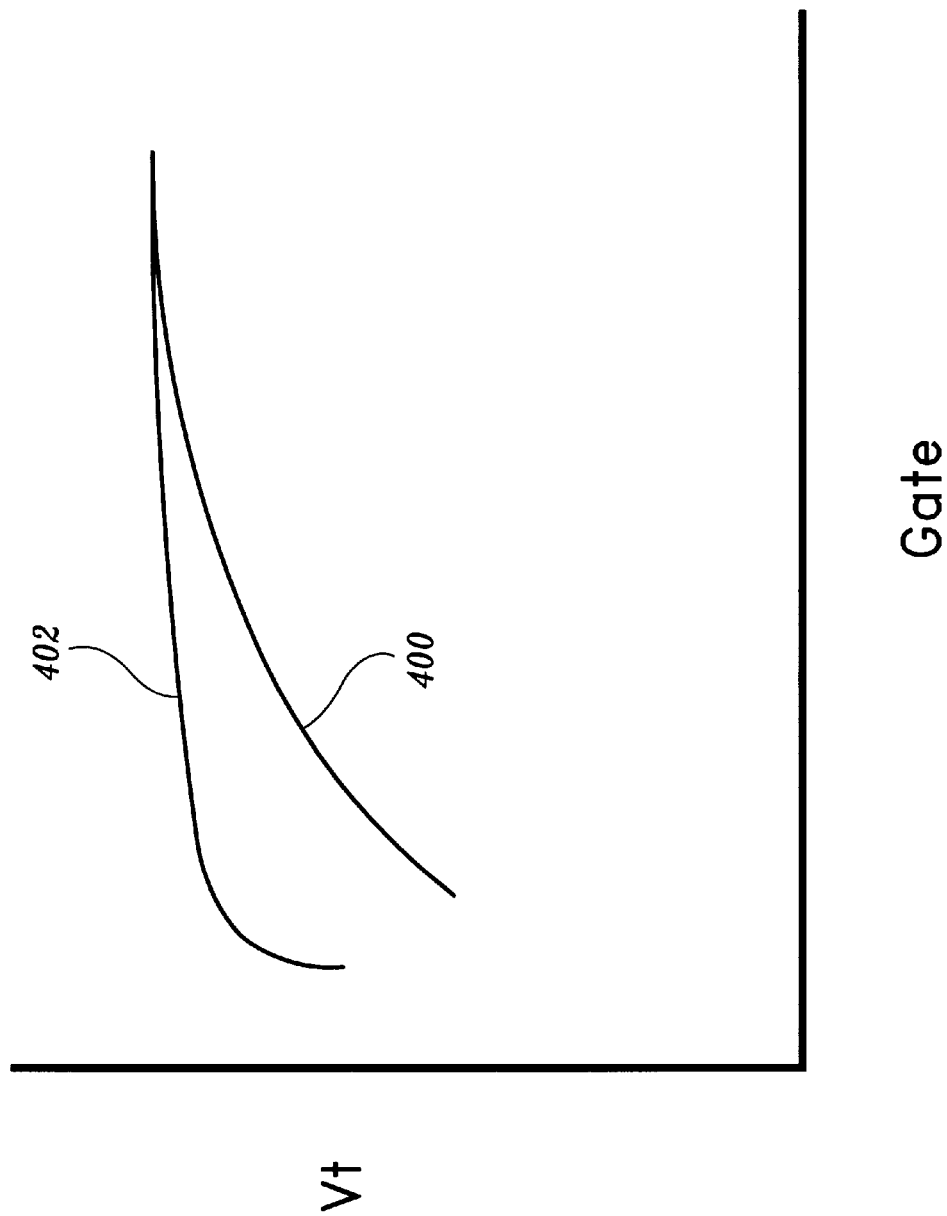
FIG. 14 is a graph of transistor performance showing threshold voltage (Vt) versus gate length (L) for a transistor with a first dopant level below the gate formed by conventional methods and a transistor with a second dopant level below the gate formed in accordance with the present invention.

Referring to FIG. 14, an illustrative graph of threshold voltage versus gate conductor length (L) is shown. A curve 400 shows the threshold voltage of a transistor in accordance with the prior art. Curve 400 represents the case of providing a dose of D dopants below a gate conductor using conventional techniques. A curve 402 illustratively represents a transistor device formed in accordance with the present invention. The threshold voltage roll-off of the transistor device formed by the present invention by employing improved halo implantation provides a dose of about 2 D dopants where D is a dose of between about $1\times10^{12}$ to about $1\times10^{13}$ atoms/cm$^2$. A constant threshold voltage curve is desirable. By providing the improved halo implantation, a higher concentration of dopants is achieved below the gate conductor thereby improving device performance. As such, curve 402 shows a significant improvement in threshold voltage roll-off.

Having described preferred embodiments for improving device performance by employing an improved method for forming halo implants (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a halo implant for semiconductor devices, comprising the steps of:

providing a substrate having a gate stack formed thereon, the gate stack including a gate conductor, the gate stack extending a longitudinal distance in a first direction along a surface of the substrate;

providing dopants of a first conductivity and dosage at an acute angle relative to a normal to the surface of the substrate; and directing the dopants at an angle of between about 30 degrees to about 60 degrees relative to the first direction such that the dopants are implanted below the gate conductor to form a halo implant for preventing current leakage for a semiconductor device.

2. The method as recited in claim 1, wherein the acute angle is between about 10 degrees and about 30 degrees.

3. The method as recited in claim 1, wherein the halo implant laterally extends between about 50 nm and about 150 nm below the gate stack.

4. The method as recited in claim 1, wherein the step of directing the dopants includes the steps of:

directing the dopants at an angle of between about 30 degrees to about 60 degrees relative to the first direction at a first position;

rotating the semiconductor device to a second position; and directing the dopants at an angle of between about 30 degrees to about 60 degrees relative to the first direction at the second position.

5. The method as recited in claim 4, further comprising the steps of:

rotating the semiconductor device to a third position;

directing the dopants at an angle of between about 30 degrees to about 60 degrees relative to the first direction at the third position;

rotating the semiconductor device to a fourth position; and directing the dopants at an angle of between about 30 degrees to about 60 degrees relative to the first direction at the fourth position.

6. The method as recited in claim 1, further comprising the step of:

forming a source and drain over the halo implant, the source and drain including dopants having a second conductivity type and having a dose of dopants of between about 1.5 D to about 2.5 D where D is a dose of between about $1\times10^{12}$ to about $1\times10^{13}$ atoms/cm$^2$.

7. The method as recited in claim 1, wherein the step of directing the dopants includes the step of:

providing a dose of between about 1.5 D to about 2.5 D for the halo implant where D is a dose of between about $1\times10^{12}$ to about $1\times10^{13}$ atoms/cm$^2$.

8. A method for forming a halo implant for semiconductor devices, comprising the steps of:

providing a substrate having a gate stack formed thereon, the gate stack including a gate conductor, the gate stack extending a longitudinal distance in a first direction along a surface of the substrate;

providing dopants of a first conductivity and dosage at an acute angle relative to a normal to the surface of the substrate;

directing the dopants at an angle of between about 30 degrees to about 60 degrees relative to the first direction such that the dopants are implanted below the gate conductor to form a halo implant;

implanting dopants of a second conductivity type over the halo implant to form source and drain regions for the semiconductor device, the halo implant for preventing current leakage from the source and drain regions; and providing a portion of the dopants of the second conductivity type below the gate conductor to stabilize a threshold voltage for the semiconductor device during operation.

9. The method as recited in claim 8, wherein the acute angle is between about 10 degrees and about 30 degrees.

10. The method as recited in claim 8, wherein the halo implant laterally extends between about 50 nm and about 150 nm below the gate stack.

11. The method as recited in claim 8, wherein the step of directing the dopants includes the steps of:

directing the dopants at an angle of between about 30 degrees to about 60 degrees relative to the first direction at a first position;

rotating the semiconductor device to a second position; and directing the dopants at an angle of between about 30 degrees to about 60 degrees relative to the first direction at the second position.

12. The method as recited in claim 11, further comprising the steps of:

rotating the semiconductor device to a third position;

directing the dopants at an angle of between about 30 degrees to about 60 degrees relative to the first direction at the third position;

rotating the semiconductor device to a fourth position; and directing the dopants at an angle of between about 30 degrees to about 60 degrees relative to the first direction at the fourth position.

13. The method as recited in claim 8, wherein the step of providing a portion of the dopants of the first conductivity type includes the step of providing a dose of between about 1.5 D to about 2.5 D where D is a dose of between about $1 \times 10^{12}$ to about $1 \times 10^{13}$ atoms/cm$^2$.

14. The method as recited in claim 8, wherein the step of implanting dopants of a second conductivity type over the halo implant to form source and drain regions for the semiconductor device includes the step of:

forming the source and drain regions having a dose of dopants of between about 1.5 D to about 2.5 D where D is a dose of between about $1 \times 10^{12}$ to about $1 \times 10^{13}$ atoms/cm$^2$.

15. A method for forming a halo implant for semiconductor devices, comprising the steps of:

providing a substrate having a plurality of gate stacks formed thereon, the gate stacks being disposed substantially parallel to each other and extending a longitudinal distance in a first direction along a surface of the substrate, each gate stack including a gate conductor;

implanting dopants into the substrate by bombarding the substrate with dopants of a first conductivity and dosage at an acute angle relative to a normal to the surface of the substrate;

directing the dopants at an angle of substantially about 45 degrees relative to the first direction such that the dopants are implanted below the gate conductor to form a halo implant having portion extending laterally below the gate stacks the halo implant for preventing current leakage from source and drain regions during operation of field effect transistors;

implanting dopants of a second conductivity type over the halo implant to form the source and drain regions for the field effect transistors; and providing a portion of the dopants of the second conductivity type below the gate conductor to stabilize a threshold voltage for the semiconductor device during operation.

16. The method as recited in claim 15, wherein the acute angle is between about 10 degrees and about 30 degrees.

17. The method as recited in claim 15, wherein the halo implant laterally extends between about 50 nm and about 150 nm below the gate stack.

18. The method as recited in claim 15, wherein the step of directing the dopants includes the steps of:

directing the dopants at an angle of substantially 45 degrees relative to the first direction at a first position;

rotating the semiconductor device to a second position; and directing the dopants at an angle of substantially 45 degrees relative to the first direction at the second position.

19. The method as recited in claim 18, further comprising the steps of:

rotating the semiconductor device to a third position;

directing the dopants at an angle of substantially 45 degrees relative to the first direction at the third position;

rotating the semiconductor device to a fourth position; and directing the dopants at an angle of substantially 45 degrees relative to the first direction at the fourth position.

20. The method as recited in claim 15, wherein the step of providing a portion of the dopants of the second conductivity type below the gate conductor includes the step of providing a dose of between about 1.5 D to about 2.5 D below the gate conductor where D is a dose of between about $1 \times 10^{12}$ to about $1 \times 10^{13}$ atoms/cm$^2$.

21. The method as recited in claim 15, wherein the step of implanting dopants of a second conductivity type over the halo implant to form source and drain regions includes the step of:

forming the source and drain regions having a dose of dopants of between about 1.5 D to about 2.5 D where D is a dose of between about $1 \times 10^{12}$ to about $1 \times 10^{13}$ atoms/cm$^2$.

\* \* \* \* \*